(12) United States Patent
Phan et al.

(10) Patent No.: US 7,118,958 B2
(45) Date of Patent: Oct. 10, 2006

(54) METHOD OF MANUFACTURING A METAL-INSULATOR-METAL CAPACITOR USING AN ETCHBACK PROCESS

(75) Inventors: Tony T. Phan, Flower Mound, TX (US); Martin B. Mollat, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 105 days.

(21) Appl. No.: 11/071,036

(22) Filed: Mar. 3, 2005

(65) Prior Publication Data

US 2006/0197134 A1    Sep. 7, 2006

(51) Int. Cl.
*H01L 21/8242* (2006.01)
*H01L 29/76* (2006.01)

(52) U.S. Cl. .................. 438/250; 438/393; 257/296
(58) Field of Classification Search ............ 438/239, 438/240, 250, 255, 393, 398; 257/296, 309, 257/310, 532
See application file for complete search history.

(56) References Cited

U.S. PATENT DOCUMENTS 5,554,558 A * 9/1996 Hsu et al. .............. 438/253
5,554,566 A * 9/1996 Lur et al. ............... 438/655
6,313,516 B1 * 11/2001 Tsui et al. .............. 257/538

\* cited by examiner

*Primary Examiner*—Tuan H. Nguyen
(74) *Attorney, Agent, or Firm*—Peter K. McLarty; W. James Brady, III; Frederick J. Telecky, Jr.

(57) ABSTRACT

The present invention provides a method for manufacturing a metal-insulator-metal (MIM) capacitor, a method for manufacturing an integrated circuit having a metal-insulator-metal (MIM) capacitor, and an integrated circuit having a metal-insulator-metal (MIM) capacitor. The method for manufacturing the metal-insulator-metal (MIM) capacitor, among other steps and without limitation, includes providing a material layer (185) over a substrate (110), and forming a refractory metal layer (210) having a thickness ($t_1$) over the substrate (110), at least a portion of the refractory metal layer (210) extending over the material layer (185). The method further includes reducing the thickness ($t_2$) of the portion of the refractory metal layer (210) extending over the material layer (185), thereby forming a thinned refractory metal layer (310), and reacting the thinned refractory metal layer (310) with at least a portion of the material layer (185) to form an electrode (440) for use in a capacitor.

24 Claims, 5 Drawing Sheets

METHOD OF MANUFACTURING A METAL-INSULATOR-METAL CAPACITOR USING AN ETCHBACK PROCESS

TECHNICAL FIELD OF THE INVENTION

The present invention is directed, in general, to a method for manufacturing a semiconductor device, and, more specifically, to a method for manufacturing a metal-insulator-metal (MIM) capacitor using an etchback process, a method for manufacturing an integrated circuit having a metal-insulator-metal (MIM) capacitor, and an integrated circuit having a metal-insulator-metal (MIM) capacitor.

BACKGROUND OF THE INVENTION

Analog and memory integrated circuits have gained wide acceptance and utility in present day technologies, and the use of capacitors in these integrated circuits is almost universal. A typical integrated circuit will often include a metal-insulator-metal (MIM) capacitor, also interchangeably referred to as a metal-oxide-metal (MOM) capacitor. MIM capacitors are desirable because they have capacitor plates that are not subject to depletion. Consequently these capacitors have a low voltage coefficient. Additionally, MIM capacitors advantageously have a low temperature coefficient and excellent voltage linearity.

MIM capacitors have also gained wide acceptance because they can be easily integrated into existing semiconductor device fabrication schemes. In many process flows, MIM capacitors are manufactured on the same level and in conjunction with the manufacture of active devices. That is, the component parts of the MIM capacitor and active device are manufactured in the same processing step. As an example, silicided source/drain contacts and silicided gate electrode contacts in NMOS and PMOS transistors, and the bottom plate of the MIM capacitor, are often made from the same metal layer, provided in a blanket deposition step.

Although the manufacture of active devices and MIM capacitor components in an integrated fashion is desirable, the performance characteristics of the MIM capacitor can suffer. In particular, it has been found that the leakage current of the typical MIM capacitor is unacceptably high, thereby limiting its use in many device applications or reducing yields of devices having acceptable operating characteristics.

Accordingly, what is needed in the art is a MIM capacitor and method of manufacture thereof that does not suffer from the disadvantages associated with conventionally manufactured MIM capacitors, as discussed above.

SUMMARY OF THE INVENTION

To address the above-discussed deficiencies of the prior art, the present invention provides a method for manufacturing a metal-insulator-metal (MIM) capacitor, a method for manufacturing an integrated circuit having a metal-insulator-metal (MIM) capacitor, and an integrated circuit having a metal-insulator-metal (MIM) capacitor. The method for manufacturing the metal-insulator-metal (MIM) capacitor, among other steps and without limitation, includes providing a material layer over a substrate, and forming a refractory metal layer having a thickness over the substrate, at least a portion of the refractory metal layer extending over the material layer. The method further includes reducing the thickness of the portion of the refractory metal layer extending over the material layer, thereby forming a thinned refractory metal layer, and reacting the thinned refractory metal layer with at least a portion of the material layer to form an electrode for use in a capacitor.

In another embodiment, the present invention provides the method for manufacturing the integrated circuit. The method for manufacturing the integrated circuit, includes among others, forming transistor devices over a substrate in a transistor device region and forming a metal-insulator-metal (MIM) capacitor over the substrate in a capacitor region, wherein the capacitor region is located proximate the transistor device region. The metal-insulator-metal (MIM) capacitor may be similar to that disclosed above or may be a different metal-insulator-metal (MIM) capacitor. Additionally, the method includes forming dielectric layers over the transistor devices and capacitor, the dielectric layers having interconnects therein for contacting the transistor devices and the capacitor and thereby forming an operational integrated circuit.

The present invention further provides an integrated circuit including the metal-insulator-metal (MIM) capacitor. The integrated circuit may include, without limitation: 1) transistor devices located over a substrate, each of the transistor devices having silicided regions having a first thickness, 2) a capacitor located over the substrate and proximate the transistor devices, a bottom electrode of the capacitor having a silicided region having a second different thickness, and 3) dielectric layers located over the transistor devices and capacitor, the dielectric layers having interconnects therein for contacting the transistor devices and the capacitor and thereby forming an operational integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
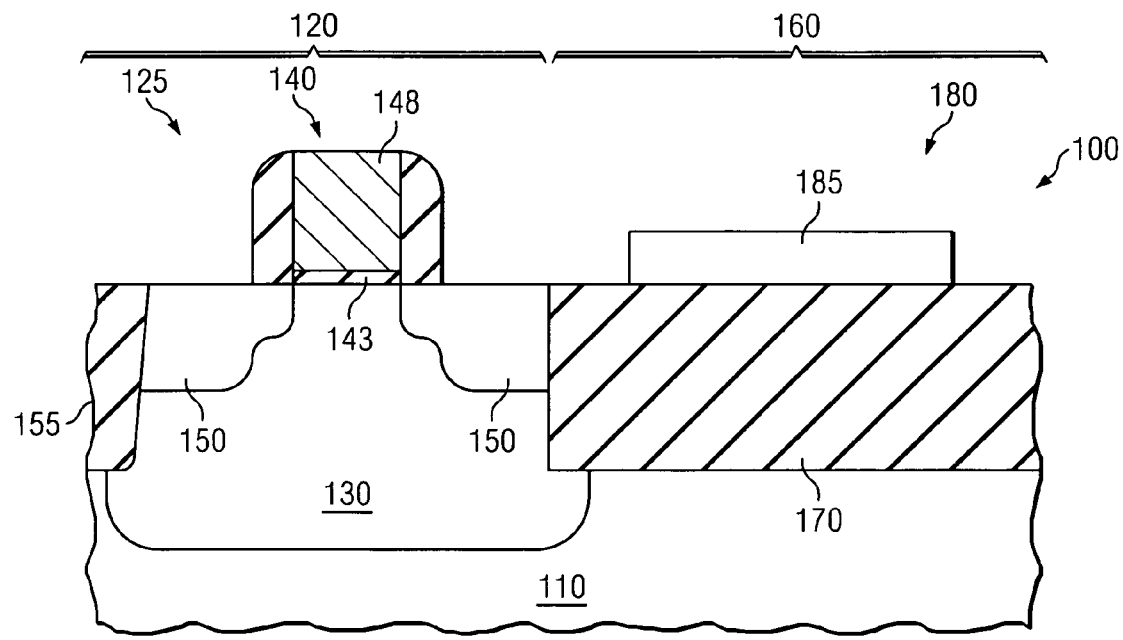
FIG. 1 illustrates a cross-sectional view of a partially completed integrated circuit at an initial stage of manufacture.

The present invention recognizes for the first time that current leakage is strongly influenced by the thickness of a portion of a bottom electrode of a metal-insulator-metal (MIM) capacitor. In particular, it has been found that increasing the thickness of a silicided refractory metal layer in the bottom electrode causes an increase in the roughness at the interface between the bottom electrode and an insulative layer located thereover.

While not limiting the scope of the invention by theory, it is presently believed that there are an increased number of positive charge traps at a rough interface as compared to a smooth interface. The increased number of positive charge traps at the interface, as well as the variable thickness of the electrode, are both thought to increase the probability that an electron will leak through the capacitor.

The present invention recognized that the thickness of the layer of refractory metal used to form at least a portion of the bottom electrode could be reduced, thus decreasing the current leakage. However, in those many instances where the same layer of refractory metal forms both the silicided regions for the source/drain contacts and gate electrode contact, as well as the silicided portion of the bottom electrode, the presence of thinner silicided regions for the source/drain contacts and gate electrode contact in the active device structures unacceptably increased the series resistance in the active devices. A higher series resistance, in turn, reduces the speed at which the active devices can operate. For example, higher series resistance can result in increased Vol levels (circuit output conditions common to IC's), which are disadvantageous.

Therein comes the present invention, which presents a unique method of manufacturing a low-leakage MIM capacitor while maintaining a low series resistance in active devices. The present invention recognized that a low-leakage MIM capacitor and low series resistance in the active devices could be achieved by first blanket depositing a refractory metal layer over both the transistor device region and capacitor region of an integrated circuit, and then thinning a portion of the refractory metal layer over the capacitor region of the integrated circuit. After thinning at least a portion of the refractory metal layer, the entire refractory metal layer may be reacted with the reactable surfaces of the transistor device region and the capacitor region. What results are transistors within the transistor device region having low series resistance, as well as the MIM capacitor within the capacitor region having limited surface roughness, and thus current leakage.

It should be noted that although the present invention is presented in the context of manufacturing MIM capacitors, it has additional applications. For example, the present invention could be implemented with respect to CMOS and bipolar processes where the speed performance and leakage are constraints. As an example, for digital UPP cell phones, speed is critical to bandwidth and low leakage is required to achieve long battery lifetime. Leakage from the SRAM circuits contributes to the static power consumption. Incorporating the principles of the present invention into an SRAM circuit could reduce the leakage.

Turning now to FIGS. 1–8, illustrated are cross-sectional views of detailed manufacturing steps illustrating how one might manufacture an integrated circuit including a MIM capacitor, in accordance with the principles of the present invention. Turning initially to FIG. 1, illustrated is a cross-sectional view of a partially completed integrated circuit 100 at an initial stage of manufacture. The partially completed integrated circuit 100 of FIG. 1 includes a substrate 110. The substrate 110 may, in an exemplary embodiment, be any layer located in the partially completed integrated circuit 100, including a wafer itself or a layer located above the wafer (e.g., epitaxial layer). In certain advantageous embodiments, the substrate 110 comprises silicon, although other conventional substrate materials, such as silicon-on-insulator, gallium arsenide, germanium, silicon-germanium, as well as other related substrates, are also within the scope of the invention. The substrate 110, as would be expected, may also be suitably doped to be a p-type or n-type semiconductor substrate.

Located over the substrate 110 are a transistor device region 120 and a capacitor region 160. The transistor device region 120 of FIG. 1 includes a partially completed transistor device 125. The partially completed transistor device 125, among other elements, initially includes a conventional well region 130 located within the substrate 110. The conventional well region 130 may be optimally doped with an n-type dopant or p-type dopant depending on the design of the integrated circuit 100. The transistor device 125 further includes a conventional gate structure 140 positioned over the well region 130. The conventional gate structure 140 includes a gate dielectric layer 143 and a gate electrode layer 148. The gate dielectric layer 143 may comprise a number of different materials and stay within the scope of the present invention. For example, the gate dielectric layer 143 may comprise silicon dioxide, or in an alternative embodiment comprise a high dielectric constant (k) material. In the illustrative embodiment of FIG. 1, however, the gate dielectric layer 143 is a silicon dioxide layer having a thickness ranging from about 0.5 nm to about 5 nm. In accordance with the principles of the present invention, the gate electrode layer 148 typically comprises a material that is capable of being silicided. One exemplary embodiment has the gate electrode layer 148, or at least a portion thereof, comprising standard polysilicon.

Located at least partially under the gate structure 140 in the transistor device region 120 are conventional source/drain regions 150. The conventional source/drain regions 150, as those skilled in the art appreciate, comprise a dopant opposite to the dopant within the well region 130. Accordingly, depending on the design of the integrated circuit 100, the conventional source/drain regions 150 may be doped with an n-type dopant or a p-type dopant. Additionally located within the substrate 110 and proximate the source/drain regions 150 may be an isolation structure 155. The isolation structure 155, along with other isolation structures and layers within the integrated circuit 100, attempt to isolate the transistor device region 120 from other active or passive device regions within the integrated circuit 100, including the capacitor region 160.

Located within the capacitor region 160 of the partially completed integrated circuit 100 may be an isolation layer 170. In certain embodiments, the isolation layer 170 comprises silicon dioxide deposited by thermal growth or other conventional techniques. The isolation layer 170 typically serves to provide electrical isolation of the capacitor region 160 from other active or passive components on the substrate 110, including the transistor device region 120. As illustrated in FIG. 1, the isolation layer 170 and the isolation structure 150 serve similar purposes and often comprise similar materials.

Located over the isolation layer 170 in the embodiment of FIG. 1 is a partially completed MIM capacitor 180. The partially completed MIM capacitor 180 in FIG. 1 initially includes a material layer 185. The material layer 185, in accordance with the principles of the present invention, should comprise a material that may be silicided. In one particularly exemplary embodiment, the material layer 185 comprises silicon, such a polysilicon. The material layer 185 advantageously comprises at least a portion of a bottom electrode 440 (FIG. 4) of the MIM capacitor 180. The material layer 185 also provides a source of silicon atoms to form a silicided refractory metal layer 430 (FIG. 4), as discussed below. It should be noted that certain preferred embodiments of the present invention (not shown) use the same blanket deposited layer of polysilicon to form both the gate electrode layer 148 and the material layer 185. Nevertheless, other embodiments exist wherein the gate electrode layer 148 and the material layer 185 are formed from different layers, whether it be different types of layers or not.

Figure 2:
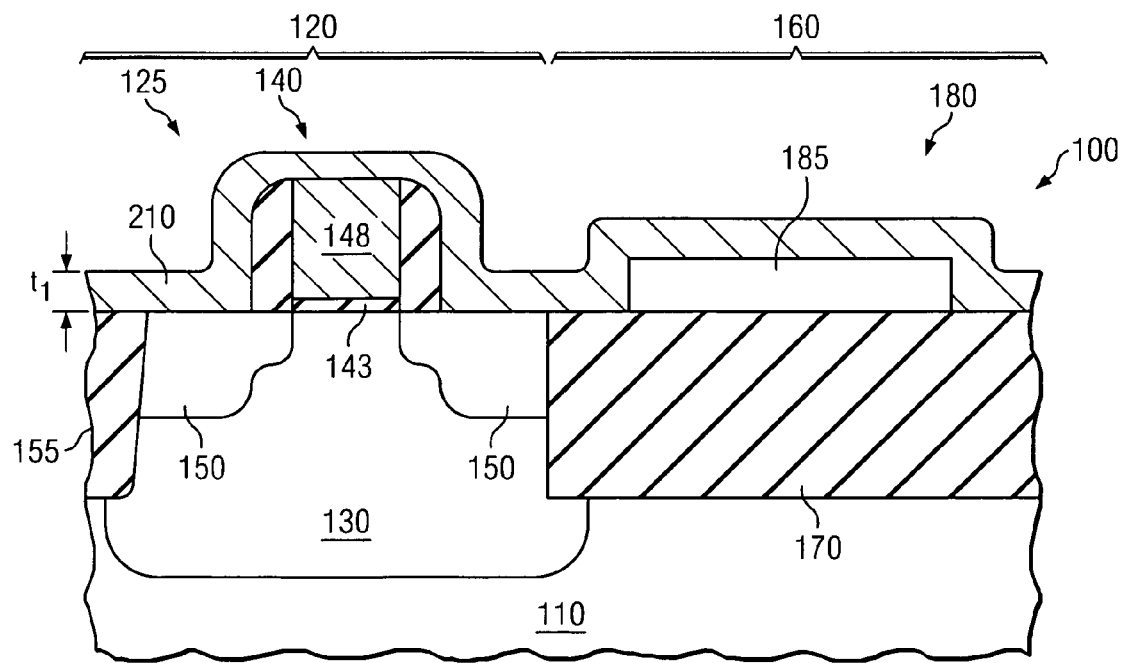
FIG. 2 illustrates a cross-sectional view of the partially completed integrated circuit illustrated in FIG. 1 after forming a refractory metal layer over the substrate.

Turning now to FIG. 2, illustrated is a cross-sectional view of the partially completed integrated circuit 100 illustrated in FIG. 1 after forming a refractory metal layer 210 over the substrate 110. For the purposes of the present invention, a refractory metal is defined as any element in Groups 4–6 and Periods 4–6 of the Periodic Table of Elements, as well as elements in the Lanthanide and Actinide series (International Union of Pure and Applied Chemist Convention for designating Groups and Periods).

As illustrated in FIG. 1, the refractory metal layer 210, or at least a portion thereof, extends over the material layer 185 and has an initial thickness ($t_1$). The refractory metal layer 210, in the exemplary embodiment illustrated in FIG. 2, however, has been blanket deposited over the entire surface of the substrate 110. The refractory metal layer 210 can be deposited using any physical vapor deposition (PVD) process, such as sputtering, as well as chemical vapor deposition (CVD) or other processes well known to those skilled in the art.

The initial thickness ($t_1$) of the refractory metal layer 210 may vary greatly while staying within the scope of the present invention. In one exemplary embodiment, the initial thickness ($t_1$) of the refractory metal layer 210 is chosen to facilitate a low series resistance in the transistor device 125. As an example, when the refractory metal layer 210 is made of titanium, such is often the case, a thickness of about 75 nm or greater, and preferably about 85 nm or greater, is exemplary. However, other thicknesses are also within the scope of the present invention. Of course, different refractory metals might require a different thickness to minimize the series resistance of the transistor device 125. One of ordinary skill in the art would understand how to adjust the thickness of the refractory metal layer 210 accordingly.

Figure 3:
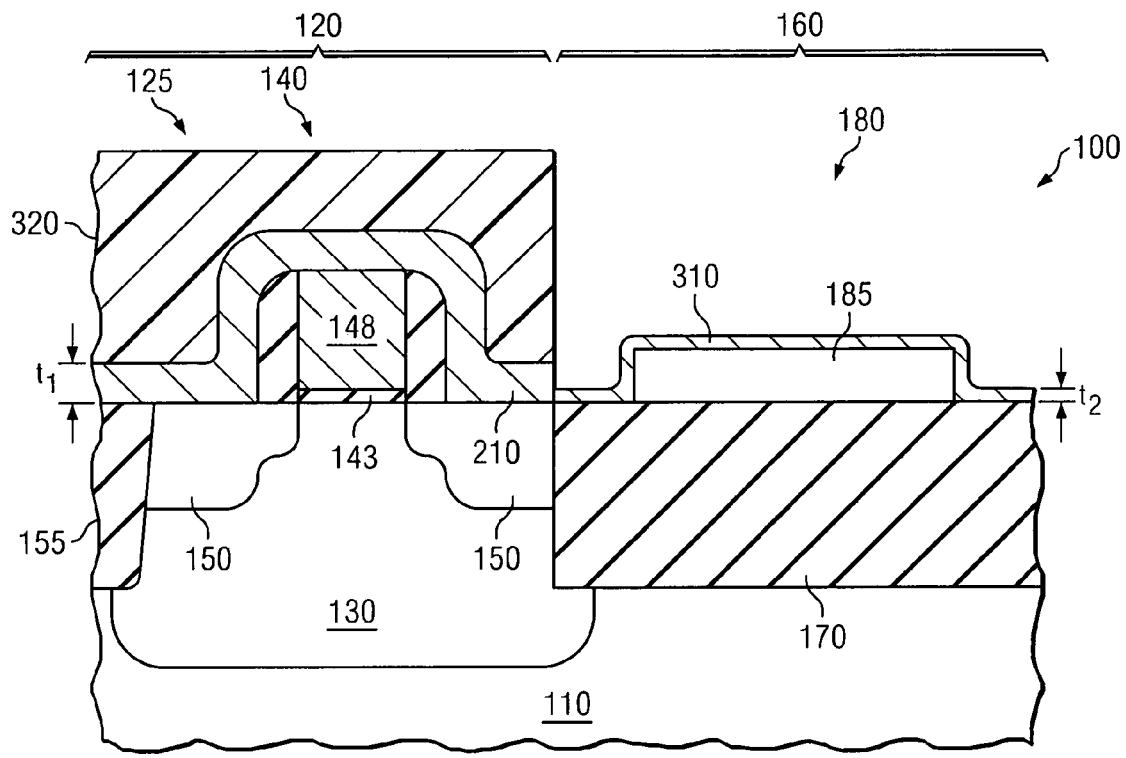
FIG. 3 illustrates a cross-sectional view of the partially completed integrated circuit illustrated in FIG. 2 after reducing the initial thickness ($t_1$) of at least a portion of the refractory metal layer, to form a thinned refractory metal layer.

Turning now to FIG. 3, illustrated is a cross-sectional view of the partially completed integrated circuit 100 illustrated in FIG. 2 after reducing the initial thickness ($t_1$) of at least a portion of the refractory metal layer 210, to form a thinned refractory metal layer 310. In the exemplary embodiment shown in FIG. 3, only the portion of the refractory metal layer 210 extending over the material layer 185 has been thinned, for the most part. Other embodiments exist, however, wherein portions that do not extend over the material layer 185 are also thinned.

The thinned refractory metal layer 310 advantageously has a thickness ($t_2$) chosen to provide the least amount of leakage in the MIM capacitor 180 possible, while staying within the scope of the present invention. Accordingly, in one exemplary embodiment wherein the thinned refractory metal layer 310 comprises titanium, the thickness ($t_2$) of the thinned refractory metal layer 310 ranges from about 30 nm to about 50 nm, and preferably from about 37 nm to about 43 nm. Obviously, the preferred thickness ($t_2$) of the thinned refractory metal layer 310 might change if the thinned refractory metal layer 310 were to comprise a different material than titanium. In the end, advantages are achieved when the thickness ($t_2$) is less than the initial thickness ($t_1$), but is greater than zero (i.e., some thinned refractory metal layer 310 remains over the material layer 185.) As the thickness ($t_2$) is advantageously greater than zero, at least a portion of the thinned refractory metal layer 310 remains over the material layer 185 to prevent it from the negative effects of the thinning process.

In certain embodiments, reducing the thickness of the refractory metal layer 210 includes forming a mask 320 over all of the semiconductor substrate 110 except the capacitor region 160. The uncovered portion of the refractory metal layer 210 is then exposed to an etchant to remove only a portion thereof. The mask 320 is preferably made of a resist material such as photoresist, and is patterned using conventional lithographic procedures.

Any conventional procedure can be used to thin the refractory metal layer 210, including wet and dry etch procedures. For instance, when the refractory metal layer 210 is titanium, a preferred wet etchant is an aqueous solution of hydrogen peroxide and ammonium. In other instances however, a dry etch is preferred because a wide variety of commercially available metal dry etch tools can be used.

Figure 4:
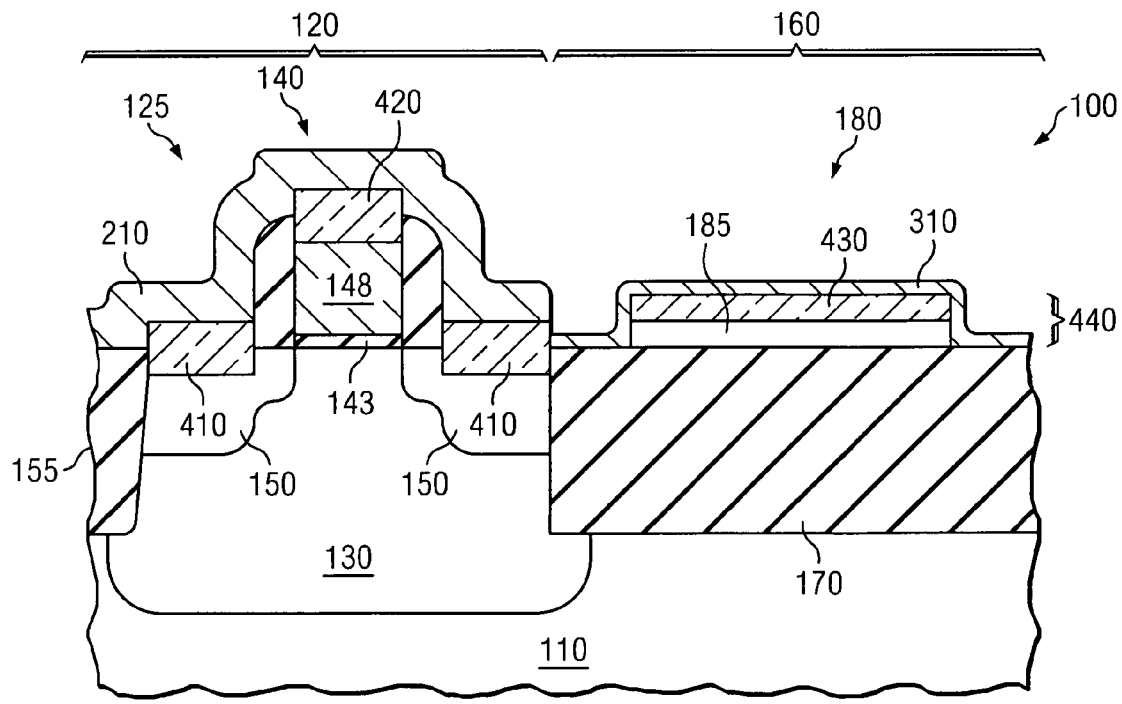
FIG. 4 illustrates a cross-sectional view of the partially completed integrated circuit illustrated in FIG. 3 after removing the mask and reacting the refractory metal layer and the thinned refractory metal layer with their respective materials.

Turning now to FIG. 4, illustrated is a cross-sectional view of the partially completed integrated circuit 100 illustrated in FIG. 3 after removing the mask 320 and reacting the refractory metal layer 210 and the thinned refractory metal layer 310 with their respective materials. For instance, the refractory metal layer 210 reacts with the source/drain regions 150 and gate electrode 148 of the transistor structure 125 to form silicided source/drain contacts 410 and a silicided gate electrode contact 420, respectively. Additionally, the thinned refractory metal layer 310 reacts with the material layer 185 to form the silicided refractory metal layer 430. Because the thickness of the thinned refractory metal layer 310 is less than the refractory metal layer 210, the thickness of the silicided refractory metal layer 430 is less than the thicknesses of the silicided source/drain contacts 410 and the silicided gate electrode contact 420. In an exemplary embodiment, the thickness of the silicided source/drain contacts 410 and the silicided gate electrode contact 420 ranges from about 120 nm to about 150 nm, and the thickness of the silicided refractory metal layer 430 ranges from about 30 nm to about 100 nm.

In preferred embodiments, the reaction requires heating the integrated circuit 100. For instance, when the refractory metal layer 210 and the thinned refractory metal layer 310 comprise titanium, it is preferable to heat to a temperature of between about 600° C. and about 900° C. for at least about 1 second. More preferably, heating comprises a first stage of heating to a temperature of about 680° C. for 20 seconds to form a metal silicide, followed by a second stage of annealing at a temperature of about 820° C. for about 45 seconds to complete the formation of the silicided source/drain contacts 410, silicided gate electrode contact 420, and silicided refractory metal layer 430. One of ordinary skill in the art would understand how to adjust the temperature and duration of heating, whether it is RTA, furnace or another type of annealing, to achieve silicidation of different refractory metals.

As illustrated in FIG. 4, unreacted portions of the refractory metal layer 210 and the thinned refractory metal layer 310 may remain after the above-described reactions. As additionally illustrated, the material layer 185 in the capacitor region 160 may not be fully consumed by the reaction to form the silicided refractory metal layer 430. In such instances, both the silicided refractory metal layer 430 and the unconsumed material layer 185 comprise a bottom electrode 440 of the MIM capacitor 180.

Figure 5:
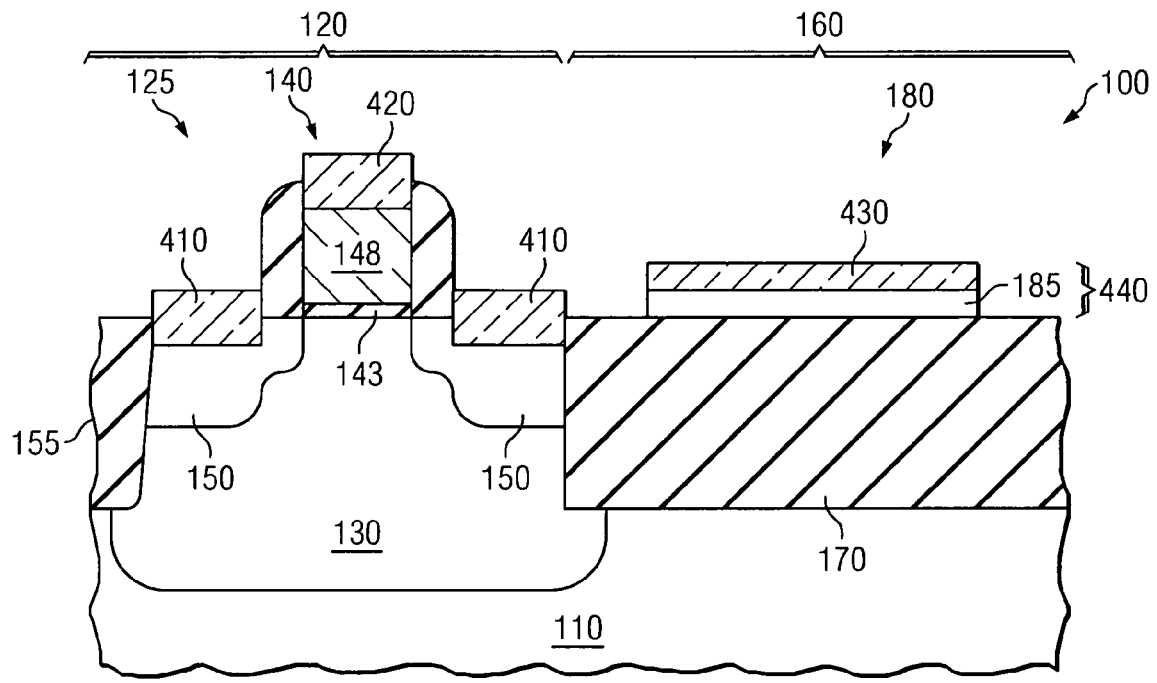
FIG. 5 illustrates a cross-sectional view of the partially completed integrated circuit illustrated in FIG. 4 after removing unreacted portions of the refractory metal layer and the thinned refractory metal layer.

Turning now to FIG. 5, illustrated is a cross-sectional view of the partially completed integrated circuit 100 illustrated in FIG. 4 after removing unreacted portions of the refractory metal layer 210 and the thinned refractory metal layer 310. As depicted FIG. 5, removal is preferably a blanket removal process, and therefore all unreacted portions are removed. The removal process is configured to selectively remove the refractory metal layer 210 and the thinned refractory metal layer 310 and retain the silicided source/drain contacts 410, silicided gate electrode contact 420, and silicided refractory metal layer 430. For instance, when the unreacted portions are made of titanium, an advantageous removal process can comprise a wet etch process using an aqueous solution of hydrogen peroxide and ammonium hydroxide. An example of a preferred wet etchant is water, hydrogen peroxide and ammonium hydroxide ($H_2O:H_2O_2:NH_4OH$) in a ratio of about 5:1:1 to about 6:1:1. Of course, any number of conventional wet etch or dry etch processes well known to those skilled in the art can be used to remove the unreacted portions.

Figure 6:
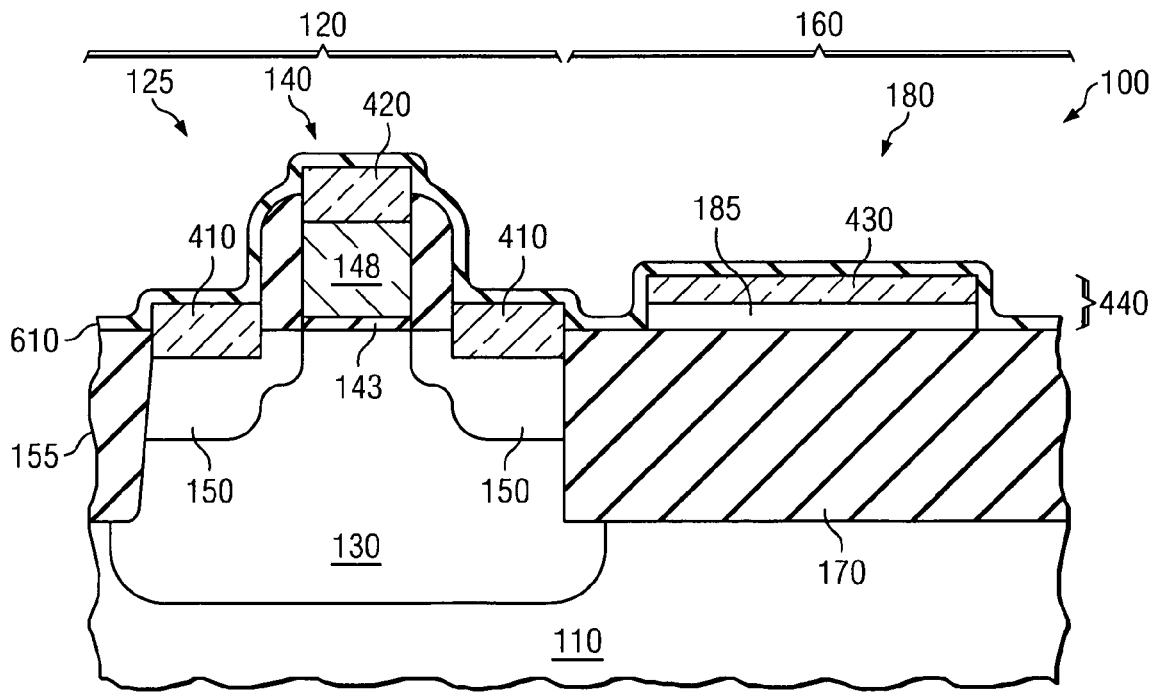
FIG. 6 illustrates a cross-sectional view of the partially completed integrated circuit illustrated in FIG. 5 after forming an insulative layer over the bottom electrode.

Turning now to FIG. 6, illustrated is a cross-sectional view of the partially completed integrated circuit 100 illustrated in FIG. 5 after forming an insulative layer 610 over the bottom electrode 440. As illustrated in FIG. 6, it can be advantageous for the insulative layer 610 to be formed over the entire substrate 110 using a blanket deposition process. Preferably, the insulative layer 610 is composed of a high-dielectric material. For the purposes of the present invention, a high-k dielectric material has a dielectric constant of greater than about 4, and more preferably, between about 6 and about 20.

The thickness of the insulative layer 610 may vary greatly and remain within the purview of the present invention. Nevertheless, in one embodiment the thickness of the insulative layer 610 ranges from about 10 nm about 100 nm, and more preferably between about 10 nm and about 70 nm. Other thicknesses outside this range may also be used and remain within the scope of the present invention.

Any conventional procedure well known to those skilled in the art can be used to form the insulative layer 610. For instance, in some cases the dielectric layer is a mixture of silicon oxide and silicon nitride applied via a low-pressure chemical vapor deposition (LPCVD) process using dichlorosilane and nitrous oxide as the source gases. In other embodiments, source gases, such as silane and TEOS, can be used to form a silicon dioxide layer via LPCVD.

Figure 7:
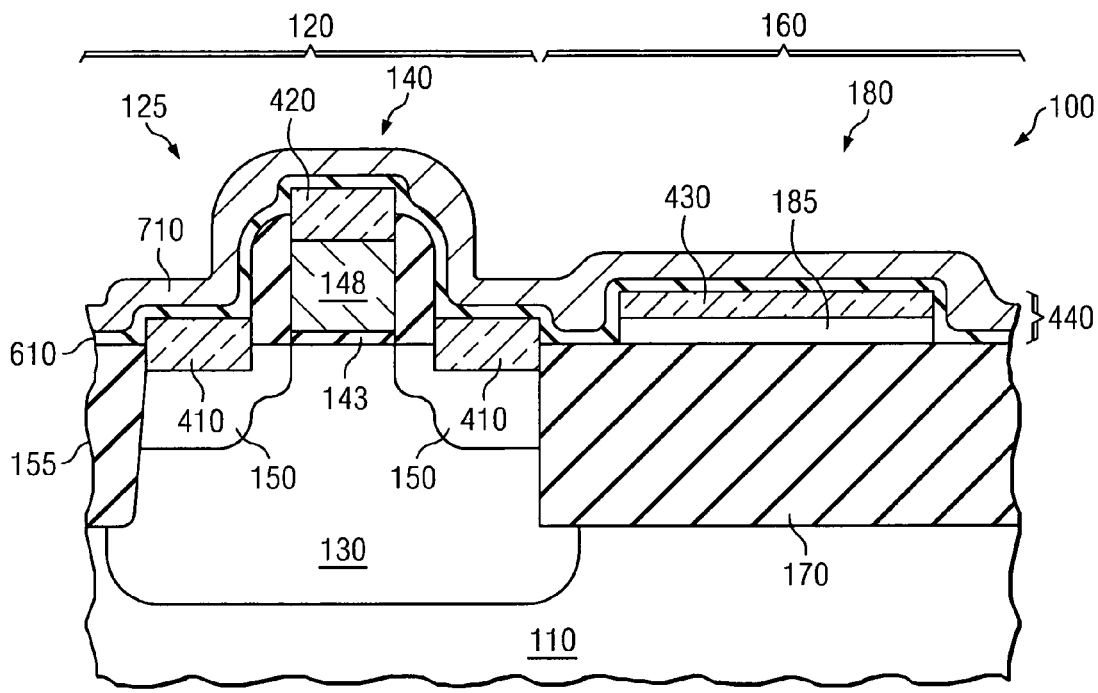
FIG. 7 illustrates a cross-sectional view of the partially completed integrated circuit illustrated in FIG. 6 after depositing a top electrode layer over the insulative layer.

Turning now to FIG. 7, illustrated is a cross-sectional view of the partially completed integrated circuit 100 illustrated in FIG. 6 after depositing a top electrode layer 710 over the insulative layer 610. As illustrated in FIG. 7, in some embodiments it is advantageous to blanket deposit the top electrode layer 710 over the substrate 110. Any conventional processes can be used to deposit the top electrode layer 710, including the same PVD or CVD processes used to form the refractory metal layer 210. In preferred embodiments, the top electrode layer 710 is a titanium-tungsten (TiW) layer deposited by sputtering. However the top electrode layer 710 can comprise any refractory metal, or other metals such as gold or aluminum, either alone or in combination, deposited as alloyed layers or separate layers.

Figure 8:
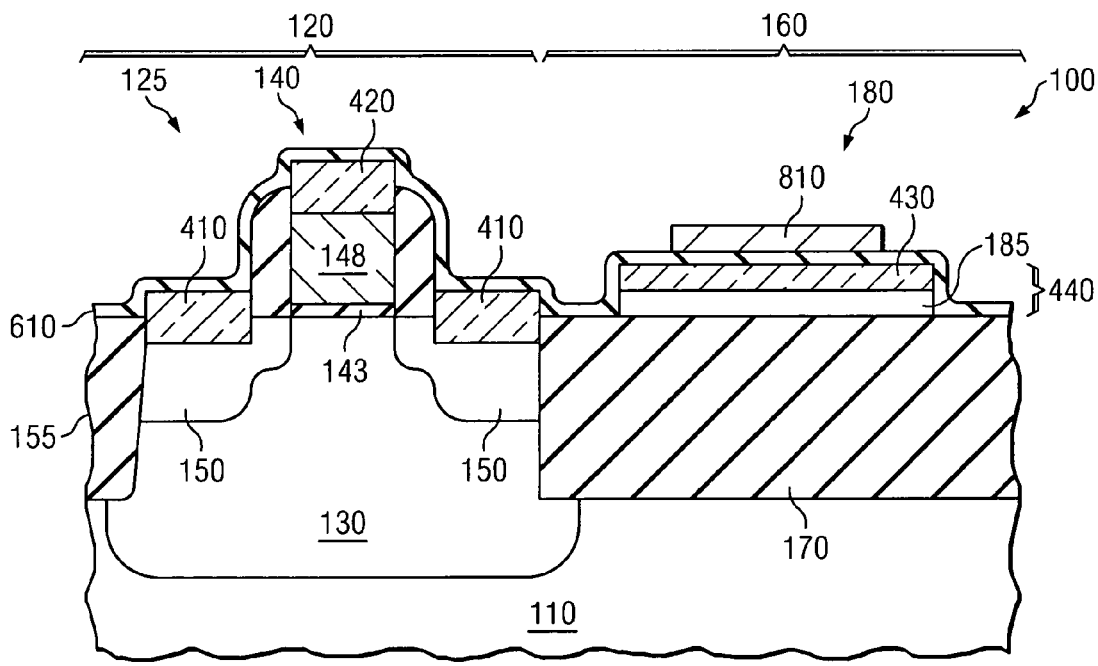
FIG. 8 illustrates a cross-sectional view of the partially completed integrated circuit illustrated in FIG. 7 after patterning the top electrode layer to form a top electrode.

Turning now to FIG. 8, illustrated is a cross-sectional view of the partially completed integrated circuit 100 illustrated in FIG. 7 after patterning the top electrode layer 710 to form a top electrode 810. As illustrated in FIG. 8, the patterning of the top electrode layer 710 may include forming a mask over the top electrode layer 710 in the capacitor region 160, and removing portions of the top electrode layer 710 that are not covered by the mask. The exposed portions of the top electrode layer 710 may be removed by conventional dry or wet etch procedures, such as dry etching using a reactive ion etching tool. In some preferred embodiments, for example, source materials of $BCl_3$ and $SF_6$, are used to generate Cl– and F– ions to facilitate dry etching of the top electrode layer 710 down to the insulative layer 610. The mask may then be removed using traditional processes.

Figure 9:
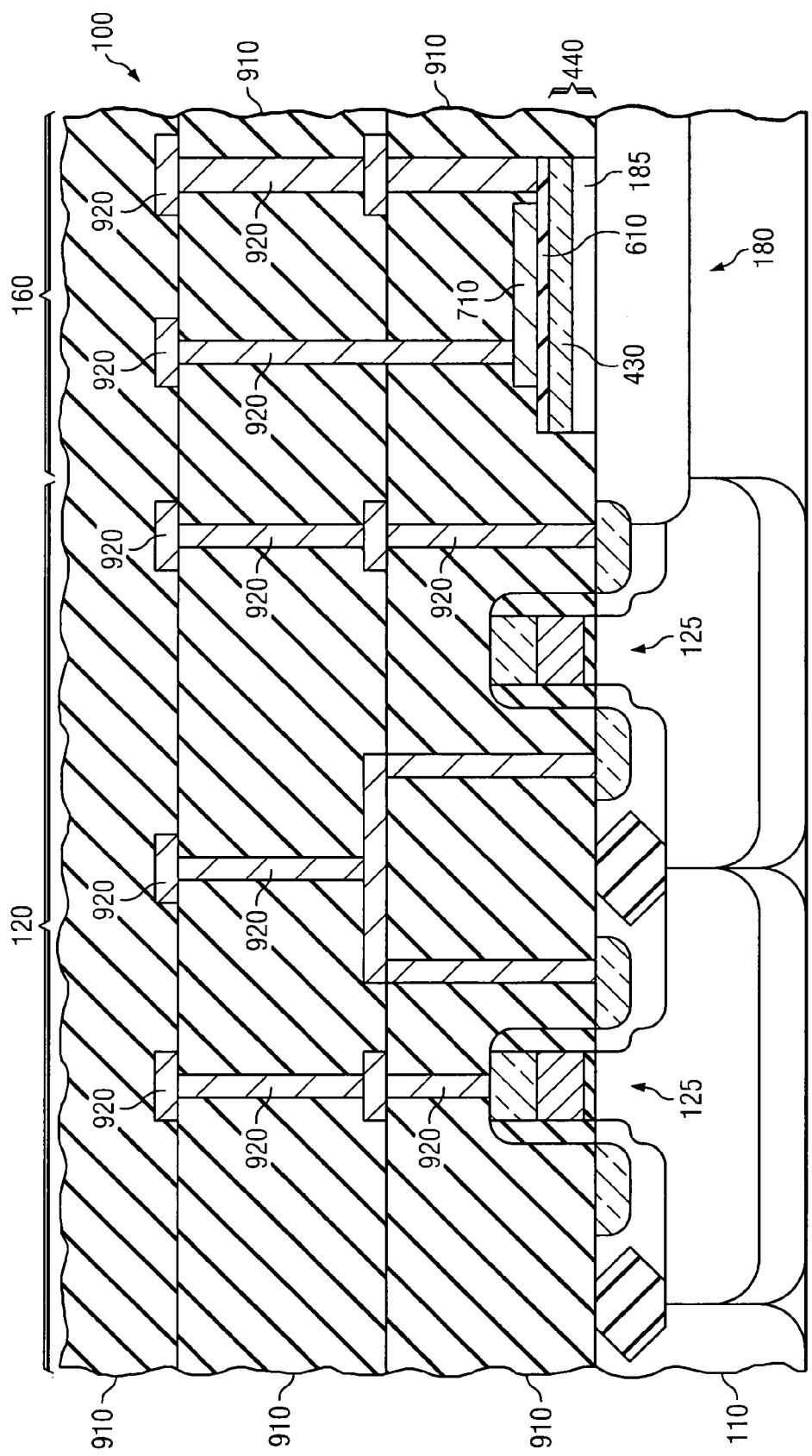
FIG. 9 illustrates a cross-sectional view of the partially completed integrated circuit illustrated in FIG. 8 after forming various layers and features to form an operational integrated circuit.

Referring finally to FIG. 9, illustrated is a cross-sectional view of the partially completed integrated circuit illustrated in FIG. 8 after forming various layers and features, thus forming an operational integrated circuit. As illustrated in FIG. 9, dielectric layers 910 have been formed over one or more transistor devices 125 and the capacitor 180. Located within the dielectric layers 910 are interconnects 920. As those skilled in the art appreciate, the interconnects 920 contact the one or more transistor devices 125 and the capacitor 180 to form the operational integrated circuit. In addition to that illustrated in FIG. 9, the integrated circuit 100 may further include devices, such as transistors used to form CMOS devices, BiCMOS devices, bipolar devices, or other types of devices. Additionally, the integrated circuit may include passive devices, such as inductors or resistors, or it may also include optical devices or optoelectronic devices. Those skilled in the art are familiar with these various types of devices and their manufacture.

A number of advantages are realized by manufacturing a MIM capacitor, as well as an integrated circuit including a MIM capacitor, according to the principles of the present invention. For example, manufacturing a MIM capacitor according to the principles of the present invention provides a smooth interface between the silicided refractory metal layer and the insulative layer of the MIM capacitor. In certain preferred embodiments, the interface has a root mean square (RMS) variation roughness of less than about 30 nm, and more preferably less than about 20 nm. Certain other preferred embodiments have the RMS variation roughness less than about 15 nm. As the RMS variation roughness of the interface is reduced, the traditional problems encountered with leakage are also reduced. Associated with this is a reduced voltage coefficient for the MIM capacitor. As an example, MIM capacitors manufactured according to the principles of the present invention are capable of achieving voltage coefficients of about 10 ppm/volt or less. Such voltage coefficient values are not attainable by other MIM capacitors, specifically when manufactured in conjunction with adjacent transistor devices, and even more specifically when the MIM capacitors and the transistor devices both use titanium silicided regions.

Another benefit of the present invention is that a thinner insulative layer can now be used than previously possible, thus the size of the MIM capacitor 180 can be reduced. The insulative layer preferably has a thickness of between about 10 nm about 100 nm and more preferably between about 10 nm and about 70 nm. As one of ordinary skill in the art would understand, capacitor leakage is inversely proportional to the thickness of the insulative layer. The presence of a smoother interface helps to reduce the high leakage current and low breakdown voltage, thereby allowing one to advantageously reduce the thickness of the insulative layer.

Although the present invention has been described in detail, those skilled in the art should understand that they could make various changes, substitutions and alterations herein without departing from the scope of the invention in its broadest form.

What is claimed is:

1. A method of manufacturing a metal-insulator-metal (MIM) capacitor, comprising:
   providing a material layer over a substrate;
   forming a refractory metal layer having a thickness over the substrate, at least a portion of the refractory metal layer extending over the material layer;
   reducing the thickness of the portion of the refractory metal layer extending over the material layer, thereby forming a thinned refractory metal layer; and
   reacting the thinned refractory metal layer with at least a portion of the material layer to form an electrode for use in a capacitor.

2. The method as recited in claim 1, wherein reducing the thickness of the portion of the refractory metal extending over the material layer includes etching the portion of the refractory metal extending over the material layer.

3. The method as recited in claim 2 further including masking off portions of the refractory metal layer not extending over the material layer prior to etching.

4. The method as recited in claim 1 wherein the thickness is about 75 nm or greater.

5. The method as recited in claim 1 wherein a thickness of the thinned refractory metal layer ranges from about 30 nm to about 50 nm.

6. The method as recited in claim 5 wherein the thickness of the thinned refractory metal layer ranges from about 37 nm to about 43 nm.

7. The method as recited in claim 1, wherein the reacting includes heating the thinned refractory metal layer.

8. The method as recited in claim 1 further including removing unreacted portions of the refractory metal layer after reacting.

9. The method as recited in claim 1, wherein the electrode is a bottom electrode, and further including forming a insulative layer over the bottom electrode and forming a top electrode over the insulative layer.

10. The method as recited in claim 9, wherein an interface between the insulative layer and the bottom electrode has a root mean square (RMS) roughness of less than about 30 nm.

11. A method of manufacturing an integrated circuit, comprising:
    forming transistor devices over a substrate in a transistor device region;
    forming a metal-insulator-metal (MIM) capacitor over the substrate in a capacitor region, wherein the capacitor region is located proximate the transistor device region, including;
       providing a material layer over the substrate in the capacitor region;
       forming a refractory metal layer having a thickness over the substrate, at least a portion of the refractory metal layer extending over the material layer;
       reducing the thickness of the portion of the refractory metal layer extending over the material layer, thereby forming a thinned refractory metal layer; and
       reacting the thinned refractory metal layer with at least a portion of the material layer to form an electrode for use in the capacitor; and
    forming dielectric layers over the transistor devices and capacitor, the dielectric layers having interconnects therein for contacting the transistor devices and the capacitor and thereby forming an operational integrated circuit.

12. The method as recited in claim 11, wherein reducing the thickness of the portion of the refractory metal extending over the material layer includes etching the portion of the refractory metal extending over the material layer.

13. The method as recited in claim 12 further including masking off portions of the refractory metal layer outside the capacitor region.

14. The method as recited in claim 11 wherein a thickness of the thinned refractory metal layer ranges from about 30 nm to about 50 nm.

15. The method as recited in claim 11, wherein the reacting includes heating the refractory metal layer, and further includes removing unreacted portions of the refractory metal layer after reacting the thinned refractory metal layer.

16. The method as recited in claim 11, wherein the electrode is a bottom electrode, and further including forming an insulative layer over the bottom electrode and forming a top electrode over the insulative layer to complete the capacitor.

17. The method as recited in claim 16, wherein an interface between the insulative layer and the bottom electrode has a root mean square (RMS) roughness of less than about 30 nm.

18. An integrated circuit, comprising:
    transistor devices located over a substrate, each of the transistor devices having silicided regions having a first thickness;
    a metal-insulator-metal (MIM) capacitor located over the substrate and proximate the transistor devices, a bottom electrode of the capacitor having a silicided region having a second different thickness; and
    dielectric layers located over the transistor devices and capacitor, the dielectric layers having interconnects therein for contacting the transistor devices and the capacitor and thereby forming an operational integrated circuit.

19. The integrated circuit as recited in claim 18 wherein the first thickness is greater than the second different thickness.

20. The integrated circuit as recited in claim 19 wherein the second different thickness ranges from about 30 nm to about 100 nm.

21. The integrated circuit as recited in claim 18 wherein the silicided regions of the transistor devices are silicided source/drain contacts and silicided gate electrode contacts.

22. The integrated circuit as recited in claim 18 wherein the capacitor further includes a top electrode located over the bottom electrode and an insulative layer located therebetween, and wherein an interface between the insulative layer and the bottom electrode has a root mean square (RMS) roughness of less than about 30 nm.

23. The integrated circuit as recited in claim 18 wherein the silicided regions of the transistor devices and the capacitor are titanium silicided regions.

24. The integrated circuit as recited in claim 23 wherein the capacitor has a voltage coefficient of about 10 ppm/volt or less.

* * * * *